United States Patent
Ohyanagi et al.

(10) Patent No.: US 7,335,928 B2
(45) Date of Patent: Feb. 26, 2008

(54) SEMICONDUCTOR DEVICE HAVING A METAL CONDUCTOR IN OHMIC CONTACT WITH THE GATE REGION ON THE BOTTOM OF EACH THE FIRST GROOVE

(75) Inventors: Takasumi Ohyanagi, Hitachinaka (JP); Atsuo Watanabe, Hitachiota (JP); Rajesh Kumar Malhan, Nagoya (JP); Tsuyoshi Yamamoto, Kariya (JP); Toshiyuki Morishita, Nagoya (JP)

(73) Assignees: Hitachi, Ltd., Tokyo (JP); Denso Corporation, Kariya, Aichi-Pref. (JP)

( * ) Notice: Subject to any disclaimer, the term of this patent is extended or adjusted under 35 U.S.C. 154(b) by 0 days.

(21) Appl. No.: 11/802,810

(22) Filed: May 25, 2007

(65) Prior Publication Data
US 2007/0221924 A1 Sep. 27, 2007

Related U.S. Application Data

(62) Division of application No. 11/138,298, filed on May 27, 2005, now Pat. No. 7,230,283.

(30) Foreign Application Priority Data
Sep. 21, 2004 (JP) ............................. 2004-272955

(51) Int. Cl.
  *H01L 29/74* (2006.01)
  *H01L 31/111* (2006.01)
(52) U.S. Cl. ...................... 257/133; 257/134; 257/136; 257/E29.265
(58) Field of Classification Search ................. 257/77, 257/133–136, 302, E29.265
  See application file for complete search history.

(56) References Cited

U.S. PATENT DOCUMENTS

| 4,338,618 | A  |   | 7/1982 | Nishizawa |
|-----------|----|---|--------|-----------|
| 6,917,054 | B2 |   | 7/2005 | Onose et al. |
| 7,005,678 | B2 | * | 2/2006 | Kumar et al. ................. 257/77 |

FOREIGN PATENT DOCUMENTS

| DE | 28 20 913 A1 | 11/1978 |
|----|--------------|---------|
| EP | 0 698 926 B1 | 10/2000 |
| WO | WO 95-18465  | 7/1995  |

OTHER PUBLICATIONS

Materials Science Forum Vols. 443-436 (2003) pp. 777-780.
IEEE Electron Device Letters vol. 24, No. 7, Jul. 2003, pp. 463-465.

* cited by examiner

*Primary Examiner*—Hoai v Pham
(74) *Attorney, Agent, or Firm*—Antonelli, Terry, Stout & Kraus, LLP.

(57) ABSTRACT

A silicon carbide semiconductor device such as JFET, SIT and the like is provided for accomplishing a reduction in on-resistance and high-speed switching operations. In the JFET or SIT which turns on/off a current with a depletion layer extending in a channel between a gate region formed along trench grooves, a gate contact layer and a gate electrode, which can be supplied with voltages from the outside, are formed on one surface of a semiconductor substrate or on the bottom of the trench groove. A metal conductor (virtual gate electrode) is formed in ohmic contact with a p++ contact layer of the gate region on the bottom of the trench grooves independently of the gate electrode. The virtual gate electrode is electrically isolated from the gate electrode and an external wire.

4 Claims, 9 Drawing Sheets

SEMICONDUCTOR DEVICE HAVING A METAL CONDUCTOR IN OHMIC CONTACT WITH THE GATE REGION ON THE BOTTOM OF EACH THE FIRST GROOVE

CROSS-REFERENCE TO RELATED APPLICATIONS

This application is a divisional application of U.S. application Ser. No. 11/138,298, filed May 27, 2005, now U.S. Pat. No. 7,230,283, and which said application claims priority from Japanese Patent Application 2004-272955, filed Sep. 21, 2004, the entire contents of which are hereby incorporated by reference into this application.

BACKGROUND OF THE INVENTION

The present invention relates to semiconductor devices, and more particularly to the structure of silicon carbide semiconductor devices which include vertical field effect transistors.

Silicon carbide (SiC) has a breakdown electric field approximately ten times larger than silicon (Si), so that when it is used for vertical field effect transistors, a drift layer (epitaxial layer) for maintaining the breakdown can be made thin and highly dense to reduce a loss. SiC-based power semiconductor devices include a junction FET (JFET) and a static induction transistor (SIT).

JP-A-9-508492 (FIGS. 6 to 11), Materials Science Forum Vols. 433-436 (2003), pp. 777-780, and IEEE ELECTRON DEVICE LETTERS VOL. 24, NO. 7, JULY 2003, pp. 463-465 disclose semiconductor devices which utilize advantages of silicon carbide (SiC). In these documents, an $n^+$ substrate which defines a drain region, and an $n^-$ epi-layer are formed from one surface side of a silicon carbide semiconductor substrate, while an n+ source region is formed on an n-type epi-layer. Here, deep trench grooves are dug into an n-type epi-layer, and a $p^+$ gate region is formed along the grooves. This $p^+$ gate region extends to a position at which it comes into contact with the $n^+$ source region. Between adjacent trench grooves, a source electrode is formed on the surface of the $n^+$ source region, which extends along the other side, through a source contact layer which is in contact with the $n^+$ source region. This source electrode is formed across the whole length of the semiconductor substrate on the opposite surface thereof in all directions, astride not only the surface of the $n^+$ source region but also the surface of an insulating material in the trench grooves. On the other hand, a gate contact layer is disposed on the bottom of the trench grooves for connection with the $p^+$ gate region. These JFET and SIT are transistors which turn on and off a current with a depletion layer which extends over a channel in the $p^+$ gate region between a pair of adjacent trench grooves. By miniaturizing the width of this channel, a so-called "normally-off" type transistor is achieved for holding an off state even when a gate voltage is zero.

Materials Science Forum Vols. 433-436 (2003) pp. 777-780 discloses that a breakdown voltage as high as 650 volts and a forward current density as high as 250 A/cm² can be accomplished by choosing the concentration of an n-type epi-layer, which serves as a drift layer, to be $3E15/cm^{-3}$, and a gate voltage Vg equal to zero volt, with a channel width of 2.0 μm and a groove width of 2.0 μm.

On the other hand, calculations made by the present inventors have revealed that a forward current density as high as 400 A/cm², even exceeding that possible with silicon insulated gate bipolar transistor (IGBT) can be accomplished by increasing an impurity concentration of an epi-layer to $2E16/cm^{-3}$, and choosing a groove width of 1.0 μm (channel width of 0.5 μm) and a groove depth of 1.2 μm. However, a narrower groove width causes difficulties in drawing out a wire through a side wall for connecting a gate electrode to an external pad because of possible disconnection of metal wiring. Also, while a pad electrode could be formed by an electrically conductive region which extends through a conductive region of the gate area to reach the pad, a large resistance of the gate area makes it impossible to accomplish a transistor which can perform high speed switching operations.

SUMMARY OF THE INVENTION

It is an object of the present invention to provide semiconductor devices which are capable of increasing the current density and accomplishing high speed switching operations.

In a preferred embodiment of the present invention, a semiconductor device such as JFET, SIT or the like includes a gate electrode in ohmic contact with a gate region, and a metal conductor (virtual gate electrode) in ohmic contact with the gate region independently of the gate electrode.

Also, in a preferred embodiment of the present invention, a semiconductor device includes a gate electrode in ohmic contact with a gate region on a surface of a semiconductor substrate on which a source electrode is disposed, and a metal conductor (virtual gate electrode) in ohmic contact with the gate region on the bottom of each trench groove independently of the gate electrode.

Further, in another preferred embodiment of the present invention, a semiconductor device includes a gate electrode which is in ohmic contact with a gate region on the bottom of a first trench groove, and a metal conductor (virtual gate electrode) in ohmic contact with the gate region on the bottom of a second trench groove.

According to the preferred embodiment of the present invention, the semiconductor device can have a high current density and reduce the gate resistance with the aid of the metal conductor (virtual gate electrode) in ohmic contact with the gate region to enable high-speed switching operations.

Other objects, features and advantages of the invention will become apparent from the following description of the embodiments of the invention taken in conjunction with the accompanying drawings.

DETAILED DESCRIPTION OF THE EMBODIMENTS

For increasing a blocking effect of a gate, it is effective to narrow down a channel width. Also, a narrower channel width can increase an impurity concentration of an n⁻ drift layer (epitaxial layer) and reduce the on-resistance of a transistor. However, the narrower channel width results in difficulties in routing a metal wire from a gate region below grooves through a groove side wall to a region above the grooves. This is because the deep grooves cause interruptions of the metal wire. On the other hand, it is possible to completely embed a metal CVD (Chemical Vapor Deposition) film in grooves, such as a plug tungsten wire used in LSIs and the like, for routing from the gate region to a region above the grooves. However, with JFET and SIT which have a source region above trench grooves, complete separation from the source region is required, thus leading to an extremely complicated manufacturing process. It is also contemplated to connect from a gate diffusion region (gate draw-out layer) on the bottom of the groove to the surface of the semiconductor substrate through a gate region and route a metal wire only on the surface of the semiconductor substrate. However, an increased resistance (R) of the gate diffusion region, i.e., an increased gate resistance and a gate capacitance (C) result in an increased CR time constant, leading to the inabilities to perform high speed switching operations.

To overcome the foregoing problems, in some embodiments of the present invention, a metal conductor (virtual gate electrode) is formed on the bottom of grooves in ohmic contact with a gate region, in addition to a gate electrode. As has been previously discussed, the metal conductor has difficulties in electric connection with the gate electrode and is insulated from the gate electrode, but is effective for reducing the gate resistance to accomplish high speed switching operations for JFET and SIT. Specifically, since an ohmic contact is formed between the metal conductor (virtual gate electrode) and the gate electrode on the bottom of the groove, the gate resistance is significantly reduced, as compared with a structure which does not have such a metal conductor.

Also, in silicon carbide (SiC), either a laminated film made of titanium and aluminum or a nickel film is generally used for a metal wire to form an ohmic contact with a p-type region. In either case, after a metal film has been formed, the resulting product is treated at high temperatures of approximately 1,000° C. to form a silicidation film between SiC and metal region, thereby forming an ohmic contact. Also, the titanium/aluminum laminate film has a smaller contact resistance than the nickel film. However, when the titanium/aluminum laminate film is thermally treated at approximately 1,000° C., aluminum will melt, so that the titanium/aluminum laminate film cannot be used in a scale-down pattern.

To address the foregoing problem, in some embodiments of the present invention, an oxide film is embedded in the grooves after the titanium/aluminum laminate film has been formed on the bottom of the grooves, before a high-temperature heat treatment. In this way, even if the titanium/aluminum laminate film melts, it will not diffuse because it is covered with the oxide film.

Also, a nickel film is formed above the grooves. The nickel film prevents the laminate film from melting even in a high temperature treatment at 1,000° C., and permits simultaneous formation of a source electrode in ohmic contact with an n-type high concentration source region.

From the foregoing strategies, the gate resistance can be reduced even in JFET and SIT which have scale-down channel widths, so that high speed switching operations can be accomplished. For example, when the semiconductor device according to the present invention is used as a high-current switching device for a PWM inverter, the device can be readily controlled and reduce a loss.

Now, some embodiments of the present invention will be described in greater detail with reference to the accompanying drawings.

Figure 1:
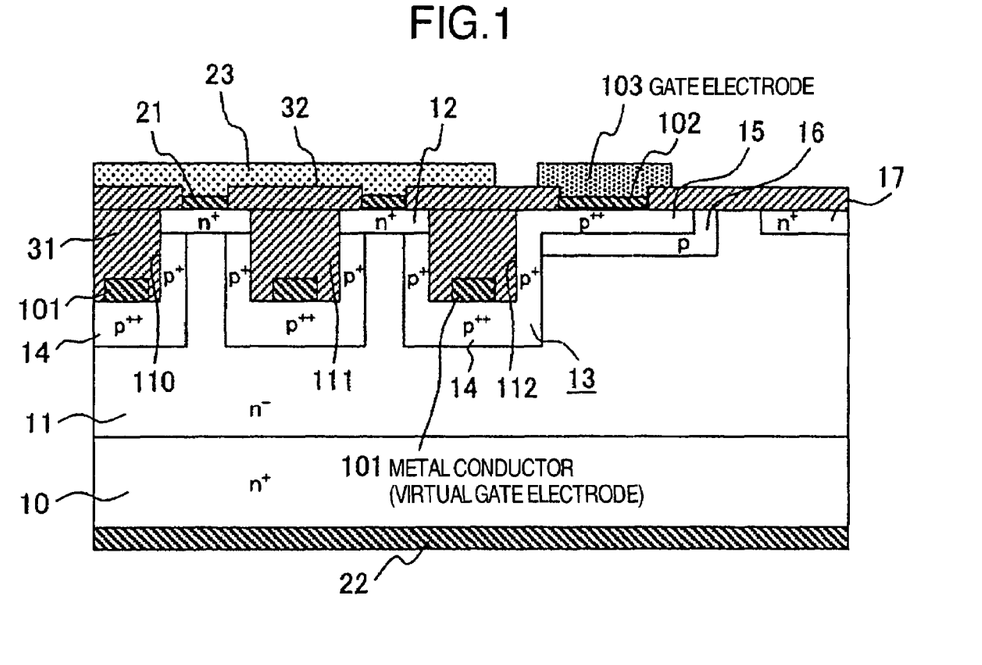
FIG. 1 is a cross-sectional view generally illustrating the structure of a static induction transistor (SIT) according to a first embodiment of the present invention.

FIG. 1 is a cross-sectional view illustrating the structure of a static induction transistor (SIT) according to a first embodiment of the present invention. In FIG. 1, a semiconductor substrate, the band gap of which is 2.0 eV or more, has a substrate 10 of a first conductivity type n⁺ (or p⁺) in a low impurity concentration, which defines a drain region, and a drain electrode 22 formed over the entirety of one surface of the substrate 10. An epitaxial layer (drift layer) 11 is formed on the opposite surface of the substrate 10. The epitaxial layer 11 has a higher impurity concentration than the substrate 10 of the first conductivity type and a low resistance. An n⁺ source region 12 is formed on the opposite surface of the semiconductor substrate. On the surface of the source region 12, a source contact layer 21 made of nickel is formed in order to form an ohmic contact. An aluminum-made source electrode 23 is disposed on the source contact layer 21. In this embodiment, the aluminum-made source electrode 23 is made thick on the assumption that the SIT is applied with a high current of approximately 400 A/cm². The drain electrode 22 is made of nickel.

A plurality of trench grooves 110-112 are formed from the opposite surface of the semiconductor substrate. A p⁺ gate region 13 is formed in the semiconductor substrate along these grooves, and extends continuously to a position at which the p⁺ gate region 13 comes into contact with the aforementioned source region 12. The gate region 13 includes a p⁺⁺ draw-out layer 15 for forming a contact with a gate contact layer 102. An aluminum-made gate electrode 103 is formed on the gate contact layer 102. A p-type field reduction region 16 is formed to surround the p⁺⁺ gate draw-out layer 15. The field reduction region 16 is not required when a breakdown voltage of interest is low. A channel stopper 17 is also formed outside the field reduction layer 16.

On the bottom of each of the trench grooves 110-112, a metal conductor (virtual gate electrode) 101 is formed, in accordance with the present invention, to be in ohmic contact with the p⁺⁺ draw-out layer 14 formed in the gate region 13. In this embodiment, the metal conductor (virtual gate electrode) 101 is made of a laminate film of titanium and aluminum.

Though insulated from the gate electrode 103 and external wiring, the metal conductors 101 are brought into ohmic contact with the gate region 13 at locations deeper than the bottoms of the trench grooves 110-112, and therefore significantly reduce the gate resistance, as compared with a structure without the metal conductors 101. In this way, the metal conductors 101 can largely reduce the gate resistance, though at locations deep in the gate region 13, and therefore produce a similar effect to that of a gate electrode, so that the metal conductors 101 can be called the "virtual gate electrodes" in this sense.

In this way, it is possible to provide high-current JFET and SIT which can reduce the gate resistance to accomplish high speed switching operations.

The trench grooves 110-112 are embedded with an insulating film (insulating material) 31, and an interlayer insulating film (insulating material) 32 is disposed between respective source contacts 21 on the surface of the semiconductor substrate.

Figure 2:
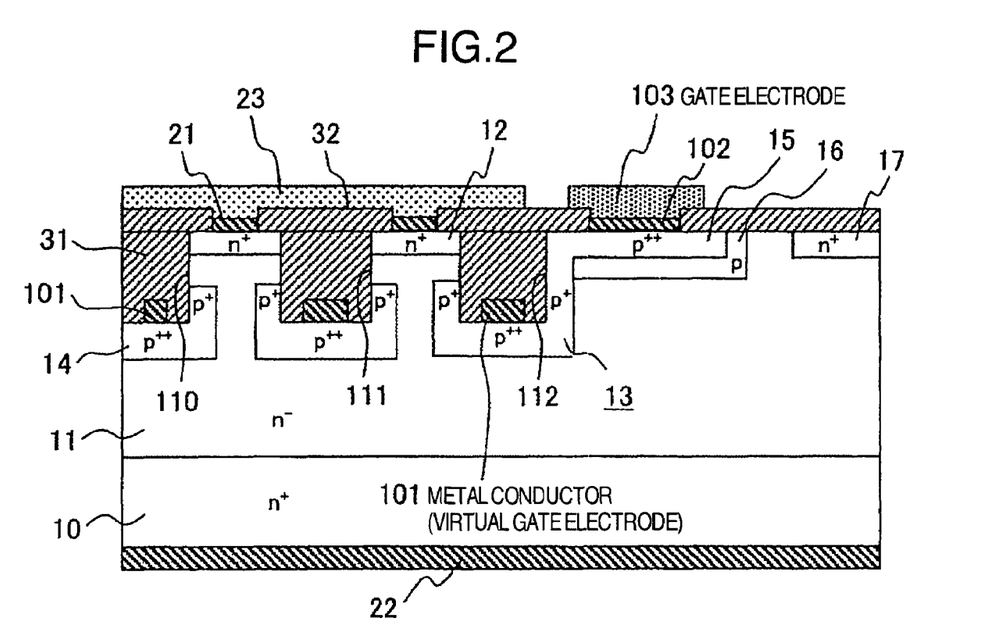
FIG. 2 is a cross-sectional view generally illustrating the structure of a SIT according to a second embodiment of the present invention.

FIG. 2 is a cross-sectional view generally illustrating the structure of a static induced transistor (SIT) according to a second embodiment of the present invention.

In the present invention, a reduction in channel width is effective for enhancing the blocking effect of the gate, however, the channel need not be reduced in width entirely in the depth direction of the channel. For this reason, the gate region 13 need not be formed over the entire side walls of the grooves. In the second embodiment, the gate region 13 is formed along the bottoms of the trench grooves 110-112 within a range in which the gate region 13 does not reach the source region 12 formed along the opposite surface of the semiconductor substrates. The metal conductor (virtual electrode) 101 is formed on the bottom of each of the trench grooves 110-112 for reducing the gate resistance, and an ohmic contact is established between the p$^{++}$ gate draw-out layer 14 and each metal conductor 101. Thus, the resulting high-current semiconductor device exhibits high-speed switching characteristics. The remaining structure is similar to that illustrated in FIG. 1.

Figure 3:
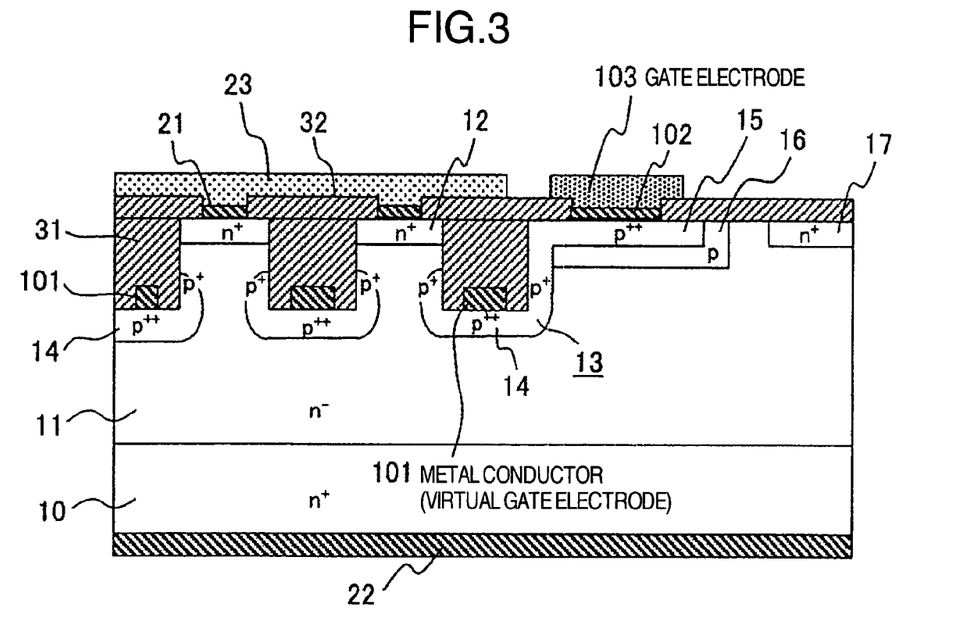
FIG. 3 is a cross-sectional view generally illustrating the structure of a SIT according to a third embodiment of the present invention.

FIG. 3 is a cross-sectional view generally illustrating the structure of a static induced transistor (SIT) according to a third embodiment of the present invention.

The structure in the third embodiment is substantially the same as that illustrated in FIG. 2 except that the gate region 13 has a rounded contour. In this embodiment, the resulting high-current semiconductor device exhibits high-speed switching characteristics, as is the case with the semiconductor device of the second embodiment illustrated in FIG. 2. The remaining structure is similar to that illustrated in FIG. 1.

Figure 4:
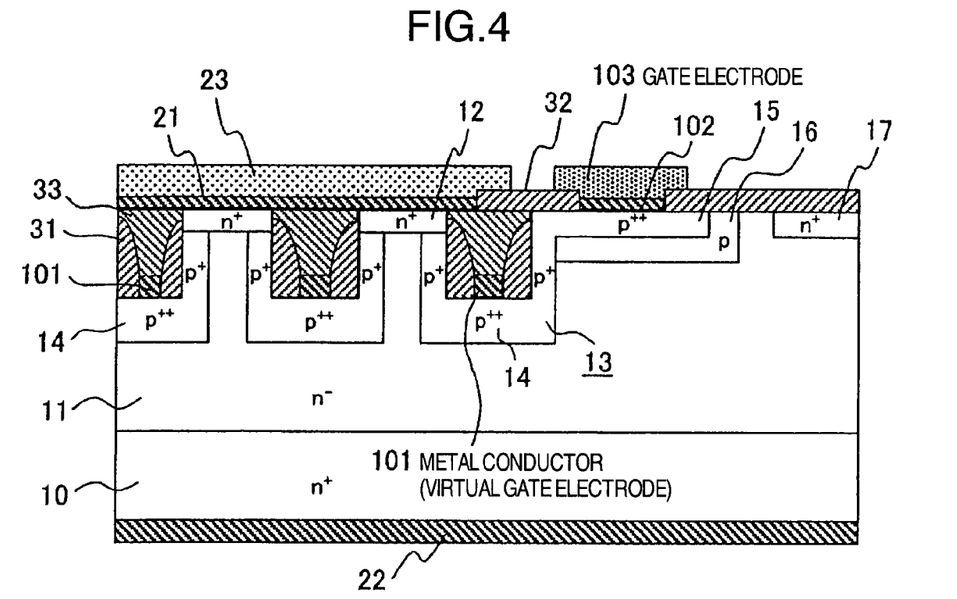
FIG. 4 is a cross-sectional view generally illustrating the structure of a SIT according to a fourth embodiment of the present invention.

FIG. 4 is a cross-sectional view generally illustrating the structure of a static induced transistor (SIT) according to a fourth embodiment of the present invention. The fourth embodiment differs from the embodiments illustrated in FIGS. 1 to 3 in that the trench grooves are embedded with an insulating film which is composed of a silicon oxide film 31 and a polysilicon film 33 in a two-region structure, and a source contact layer 21 is formed not only on the source region 12 but also on the polysilicon film 33 which overlie the trench grooves.

When a contact hole is formed above the source region 12 after the interlayer insulating film 32 has been formed, a dry etching or a wet etching method is used. In this event, when a silicon oxide film is formed above the trench grooves as in the first embodiment, the silicon oxide film within the trench grooves is also etched during the etching, possibly causing the gate region 13 to come into contact with the source contact layer 21.

On the other hand, the polysilicon film 33, filled in the trench grooves as in the fourth embodiment, is not etched, so that the source contact layer 21 can be formed not only on the source region 12 but also over the trench grooves. This eliminates the need for taking into consideration a misalignment of the contact hole to the source region 12, thus making it possible to achieve further scaling down.

Figure 5:
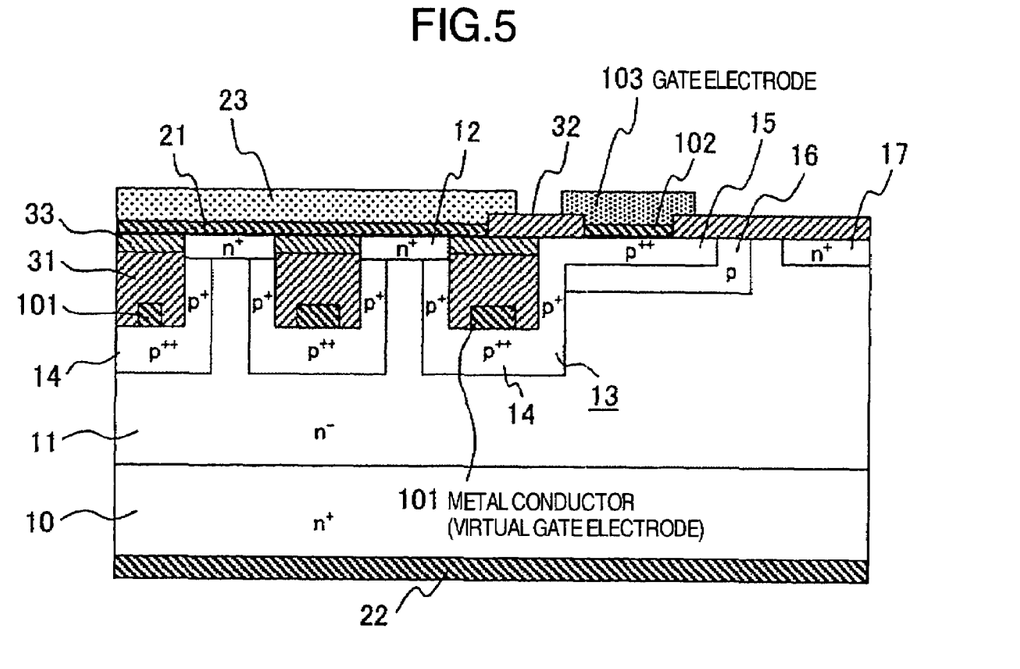
FIG. 5 is a cross-sectional view generally illustrating the structure of a SIT according to a fifth embodiment of the present invention.

FIG. 5 is a cross-sectional view generally illustrating the structure of a static induced transistor (SIT) according to a fifth embodiment of the present invention. The fifth embodiment in FIG. 5 differs from the fourth embodiment in FIG. 4 in the way the silicon oxide film 31 and polysilicon film 33 are embedded in the trench grooves. Anyway, these films are embedded such that the polysilicon film 33 extends over the entire width of the trench grooves 110-112.

In the foregoing way of embedding the silicon oxide film 31 and polysilicon film 33, a misalignment of the contact hole with the source region 12 need not be taken into consideration, thus making it possible to achieve further scaling down, as is the case with the fourth embodiment.

Figure 6:
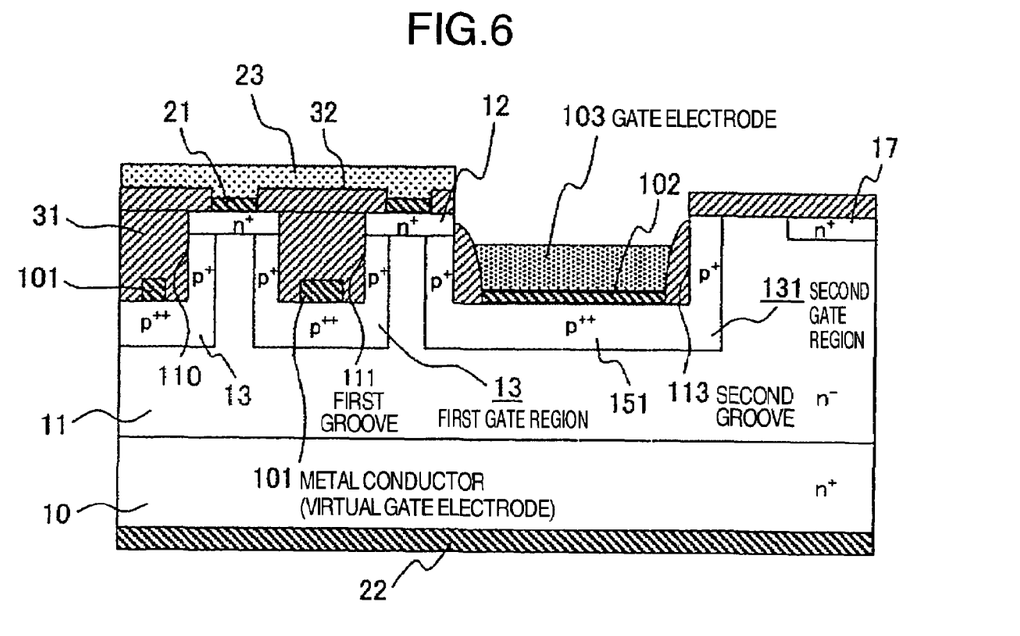
FIG. 6 is a cross-sectional view generally illustrating the structure of a SIT according to a sixth embodiment of the present invention.

FIG. 6 is a cross-sectional view generally illustrating the structure of a static induced transistor (SIT) according to a sixth embodiment of the present invention.

The sixth embodiment differs from the first embodiment illustrated in FIG. 1 in that the gate contact layer 102 and gate electrode 103 are formed on the bottom of one of the trench grooves. Specifically, assuming that the trench grooves 110, 111, identical to those in FIG. 1, are designated first grooves, a second p-type gate region 131 is also formed along a second trench groove 113. Then, the gate contact layer 102 and gate electrode 103 are formed on the bottom of the second trench groove 113 in opposition to a draw-out layer 151 in the second p-type gate region 131.

Likewise, in the sixth embodiment, since the on-resistance is lower as the channel width is narrower, the gate resistance is preferably reduced as well in the first gate region 13 within the region in which the source electrode 23 is formed. To meet this requirement, the metal conductor (virtual gate electrode) 101 is formed on the bottom of each of the trench grooves 110, 111 independently of the gate contact layer 102 and gate electrode 103, thereby reducing the gate resistance to enable high-speed switching operations.

Figure 7:
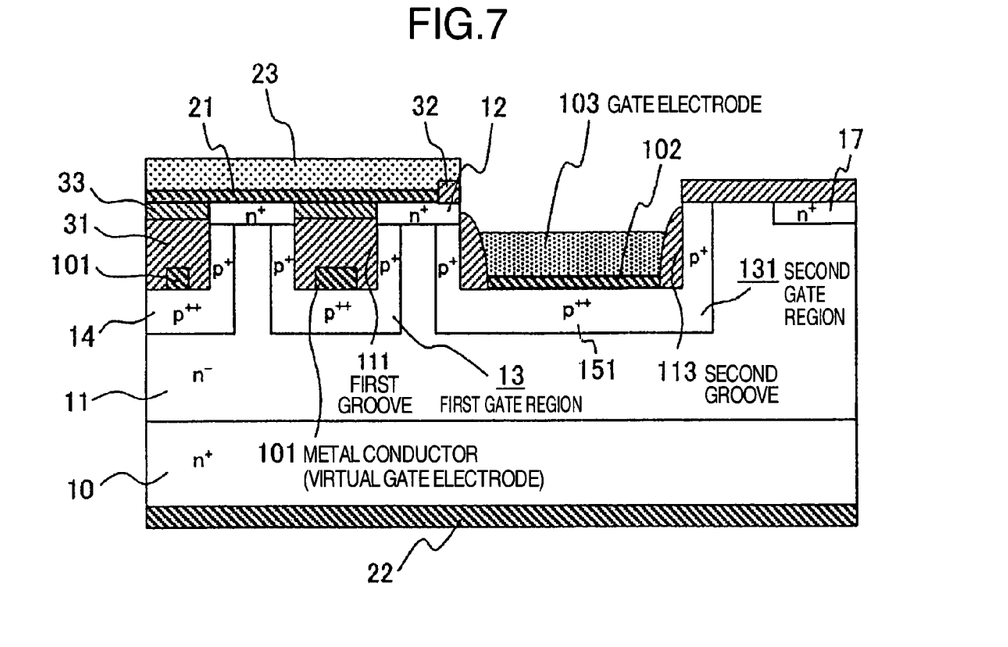
FIG. 7 is a cross-sectional view generally illustrating the structure of a SIT according to a seventh embodiment of the present invention.

FIG. 7 is a cross-sectional view generally illustrating the structure of a static induced transistor (SIT) according to a seventh embodiment of the present invention.

A difference between the seventh embodiment and the sixth embodiment illustrated in FIG. 6 is the same as the difference between the first embodiment in FIG. 1 and the fifth embodiment in FIG. 5. Specifically, the silicon oxide film 31 and polysilicon film 33 are embedded in the trench grooves 110-112 such that the polysilicon film 33 extends over the entire width of the trench grooves 110-112, thereby eliminating the need for taking into consideration a misalignment of the contact hole to the source region 12 to achieve further scaling down.

Figure 8:
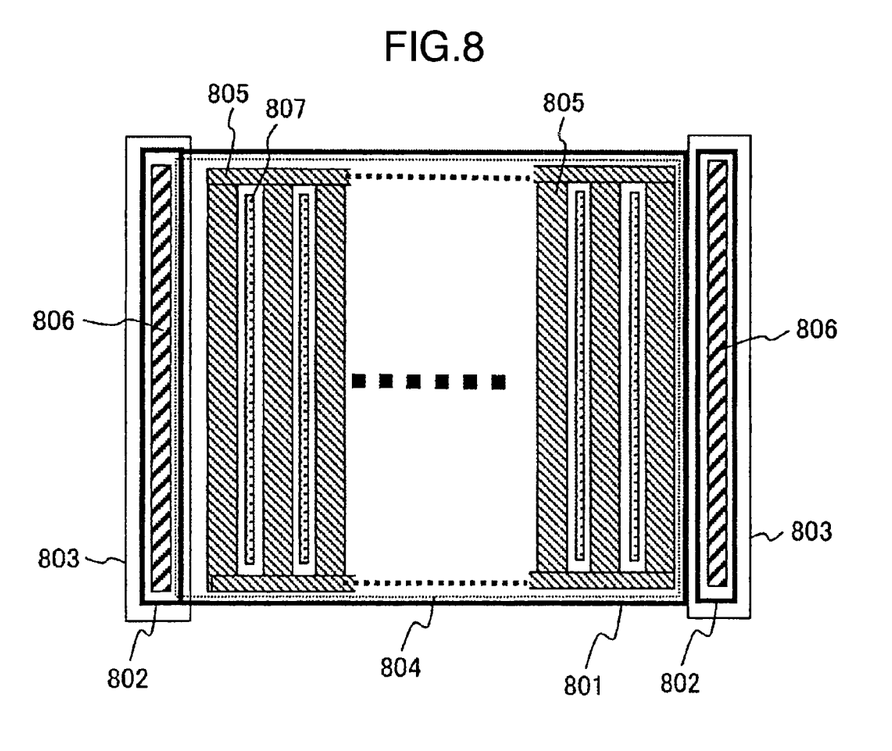
FIG. 8 is a top plan view illustrating the layout of a mask pattern for implementing the first embodiment of the present invention.

FIG. 8 is a top plan view illustrating the layout of a mask pattern for implementing the first embodiment of the present invention. The layout includes a mask pattern 801 for a source contact layer, and a mask pattern 802 for a gate contact layer, with which the semiconductor substrate is processed such that contact regions are left within respective rectangles defined thereby. A mask pattern 803 for a gate draw-out layer is intended to inject ions within a rectangle defined thereby. A mask pattern 804 for an n-type source region is intended to inject ions within a rectangle defined thereby. A mask pattern 805 for trench grooves is intended to form grooves within a rectangle defined thereby. In this embodiment, after forming the mask pattern 804 for an n-type source region, grooves are formed using the mask pattern 805 for trench grooves. A mask pattern 806 for making a contact hole for connecting the gate draw-out layer 15 to the gate contact layer 102, shown in FIG. 1, is intended to make a contact hole within a rectangle defined thereby. A mask pattern 807 for making a contact hole for connecting the source region 12 to the source contact layer 21, shown in FIG. 1, is intended to make a contact hole within a rectangle defined thereby.

Figure 9:
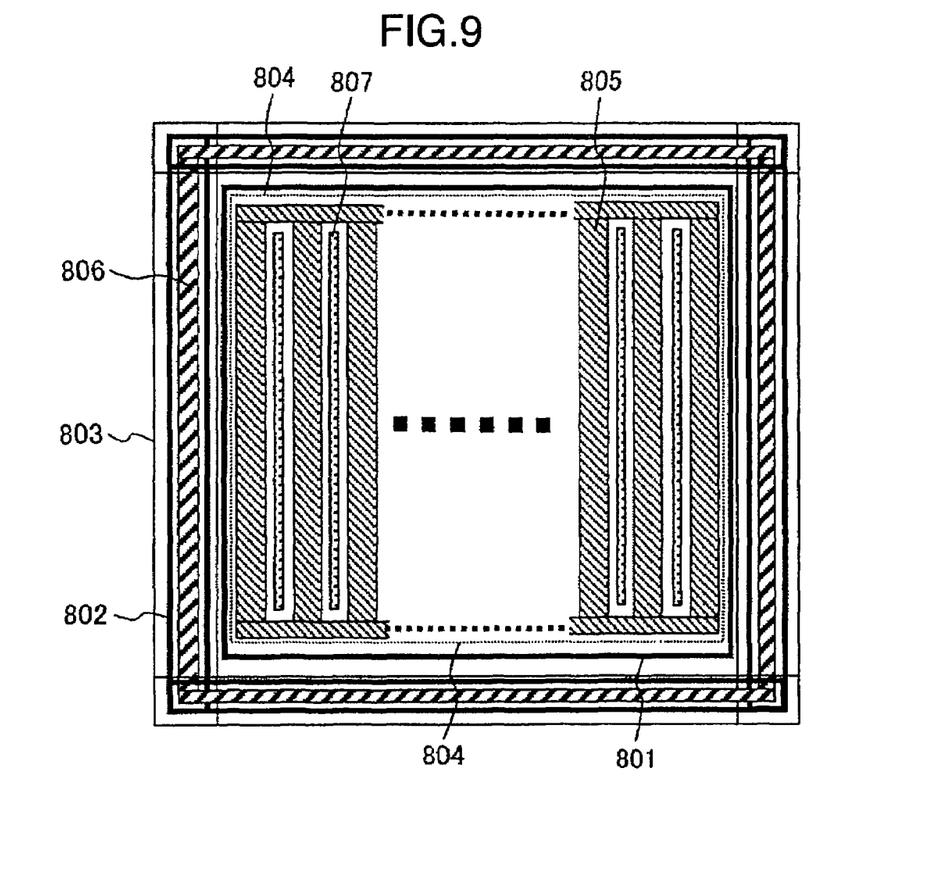
FIG. 9 is a top plan view illustrating the layout of another mask pattern for implementing the first embodiment of the present invention.

FIG. 9 is a top plan view illustrating the layout of another mask pattern for implementing the first embodiment of the present invention. When the source contact layer mask pattern 801 is surrounded by the gate contact layer mask pattern 802, a two-layered contact region is required for intersecting the source contact layer 21 with the gate contact layer 102. However, a further reduction can be achieved in the gate resistance.

The mask patterns illustrated in FIGS. 8 and 9 are unit cells, and a high-current device is created by arranging a large number of these unit cells in the vertical and horizontal directions.

Figure 10A:
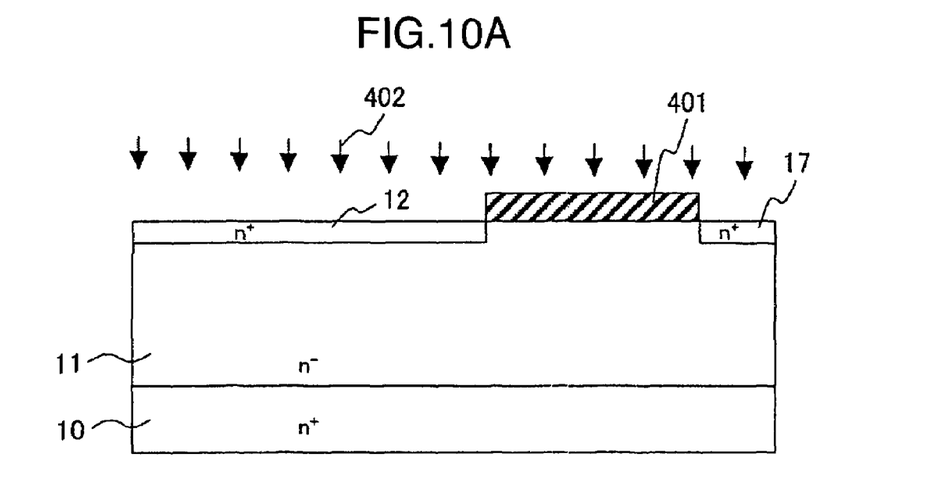
FIGS. 10A to 10I are cross-sectional views illustrating the structure of the SIT in manufacturing steps A-I for manufacturing the SIT according to the first embodiment of the present invention.
Figure 10B:
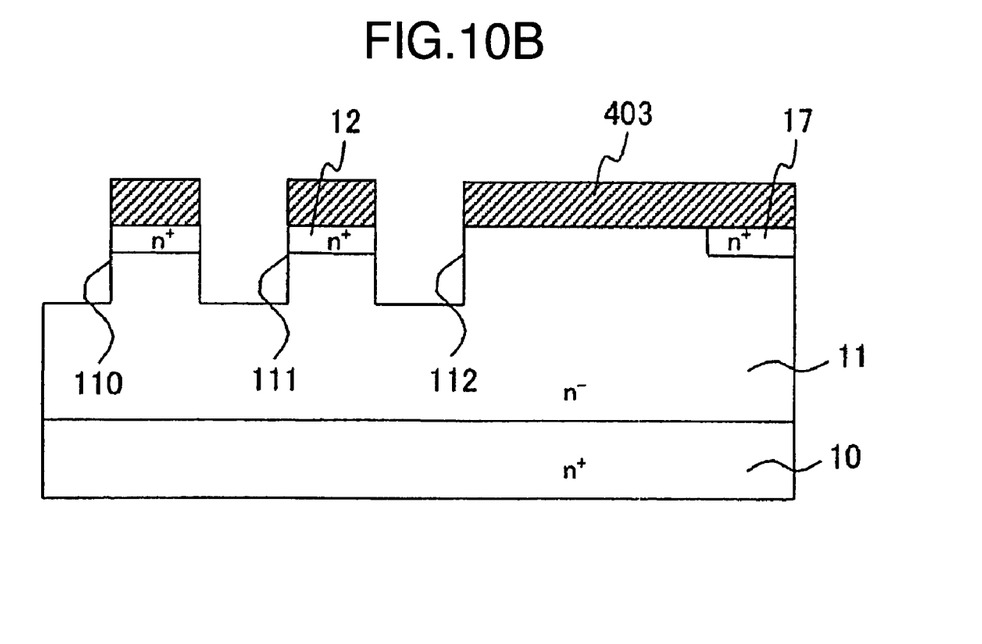

FIGS. 10A to 10I are cross-sectional views illustrating the structure of the SIT in manufacturing steps A-I for manufacturing the SIT according to the first embodiment of the present invention. As illustrated in FIG. 10A, a photo-resist 401 is coated on an n⁺ substrate 10 and an n-type 4H-SiC base which includes an epi-layer 11, for example, having a thickness of 6 μm and a concentration of $2E16/cm^{-3}$, and is processed in desired regions. Subsequently, n-type impurity ions 402 such as nitrogen ions, phosphor ions or the like are injected to form n-type regions 12, 17. Then, the photo-resist is removed, and a silicon oxide film 403 is deposited, for example, by a CVD (Chemical Vapor Deposition) method or the like, as shown in FIG. 10B, and processed into a desired shape using the photo-resist 401 and the like as a mask. Subsequently, trench grooves of 1.2 μm depth are formed in the SiC base, as shown in FIG. 10B, using the silicon oxide film 403 as a mask.

Figure 10C:
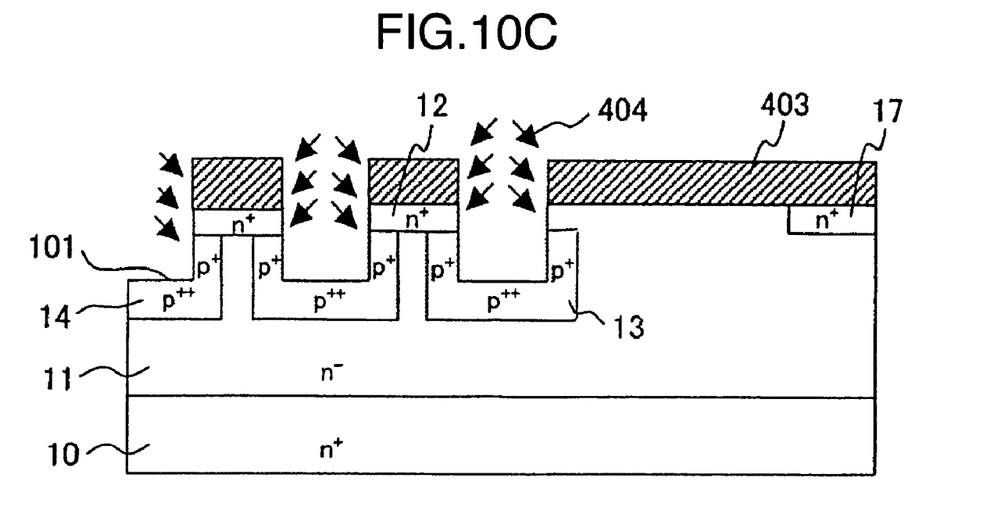
Figure 10D:
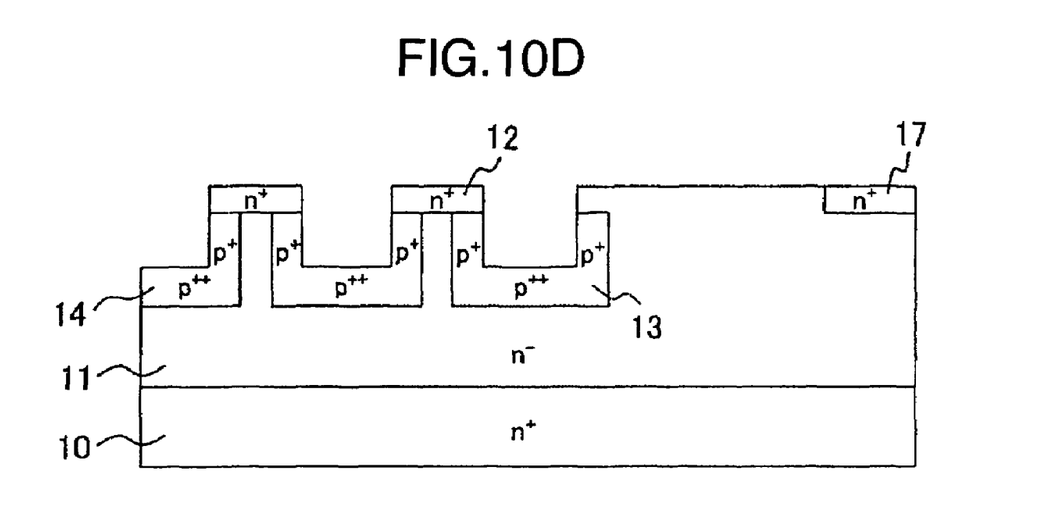

Next, as shown in FIG. 10C, p-type impurity ions 404, for example, aluminum ions, boron ions or the like are injected into the base once to several times with an inclination of several degrees to several tens of degrees to the base and with energy ranging from several tens to several hundreds of keV to form a p-type region 13. Also, p-type impurity ions 404, for example, aluminum ions, a boron ions or the like are perpendicularly injected into the base once to several times with energy ranging from several tens to several hundreds of keV to form a draw-out layer 14 within the p-type gate region 13. Here, as illustrated in FIG. 10D, the silicon oxide film 403 and the like are all removed, and the resulting base is annealed, for example, in an argon atmosphere to recover from defects caused by the ion injection.

Figure 10E:
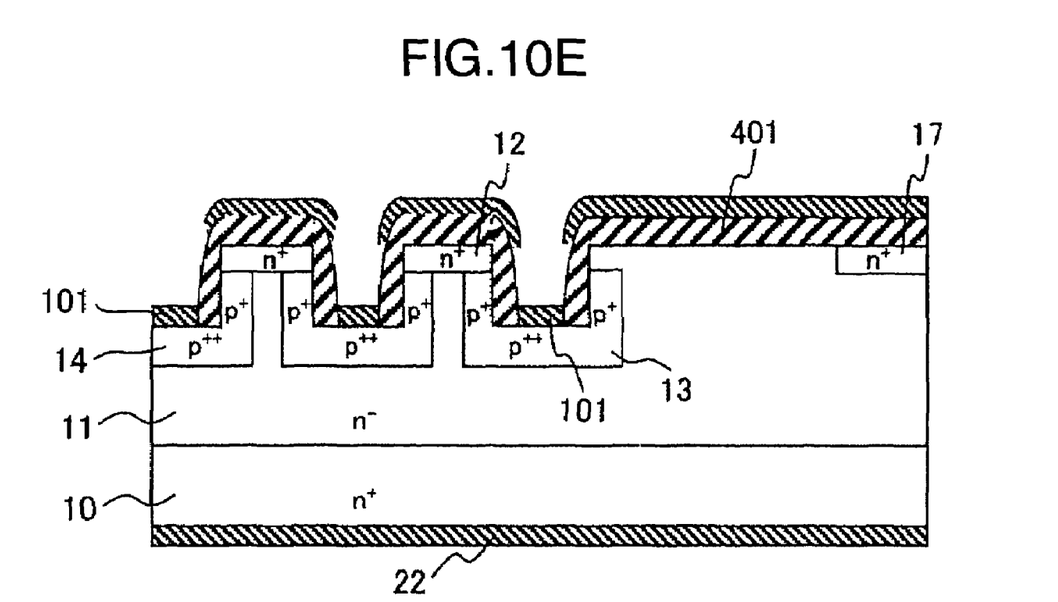

Next, as illustrated in FIG. 10E, a metal, for example, nickel or the like is vapor deposited over the semiconductor substrate to form a drain electrode 22. Also, a photo-resist 401 is coated on the base and processed to remove desired regions. Subsequently, as illustrated in FIG. 10E, a metal, for example, a laminate film made of titanium and aluminum, or a single film of nickel or the like is vapor deposited to form the foundation of a metal conductor (virtual gate electrode) 101 according to the present invention.

Figure 10F:
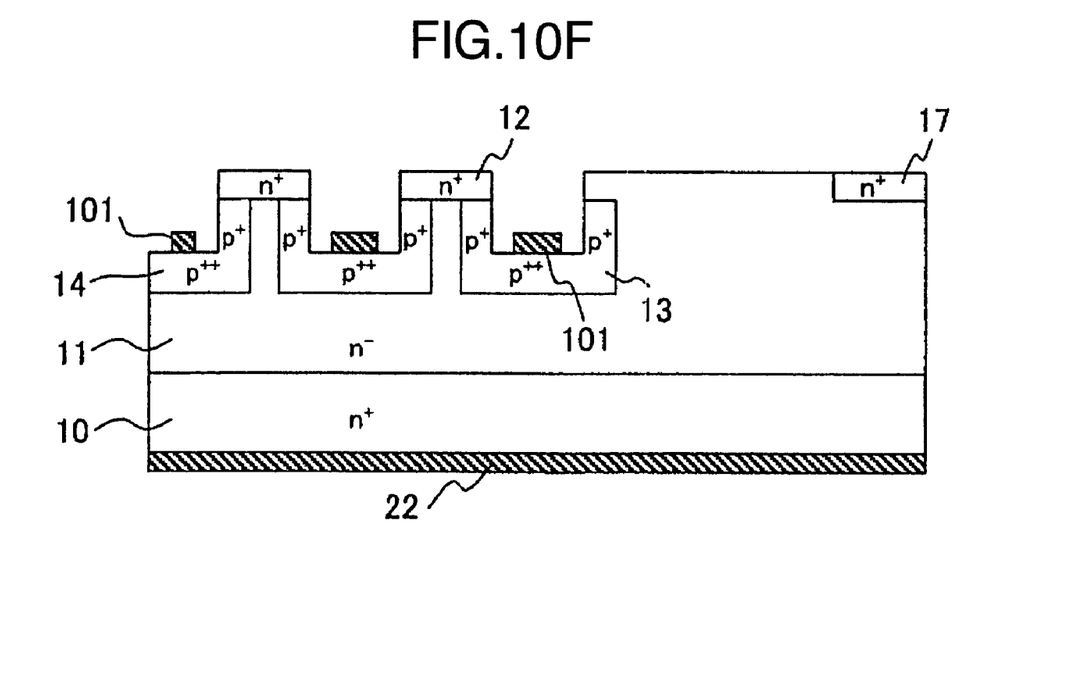

Here, the resist 401 is removed, as shown in FIG. 10F.

Figure 10G:
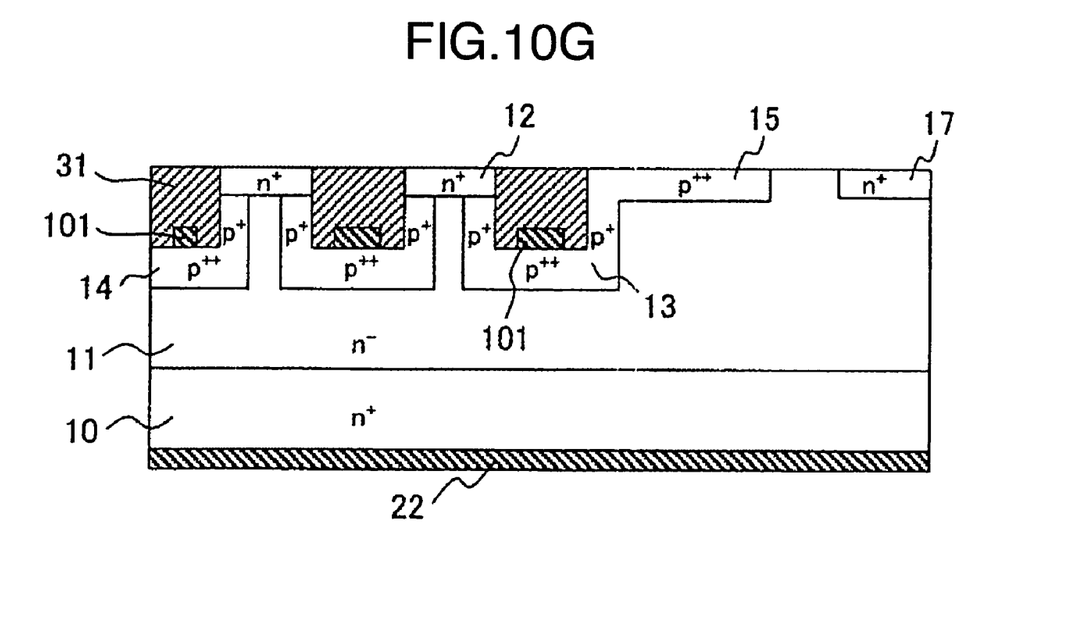
Figure 10H:
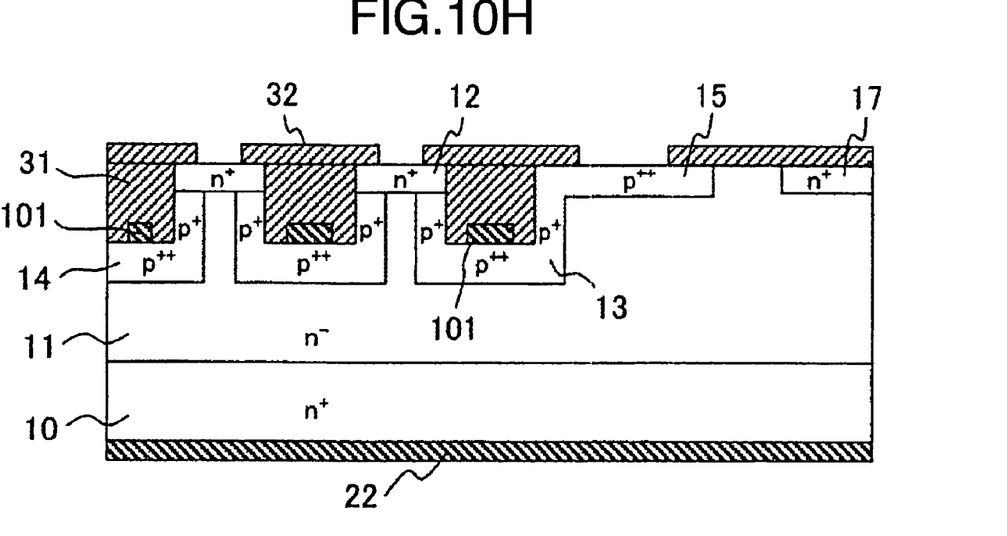
Figure 10I:
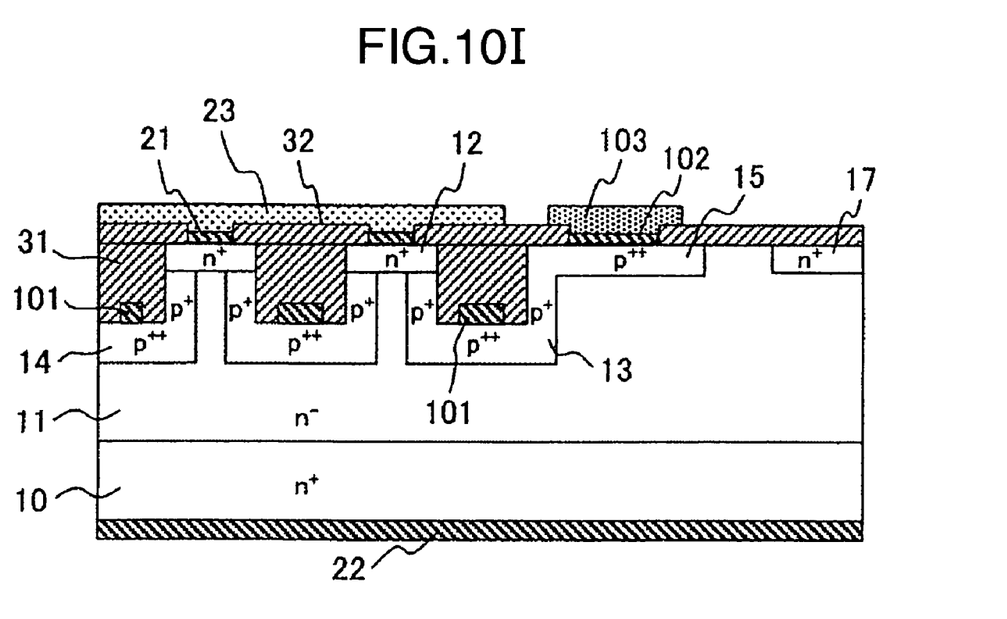

Next, as illustrated in FIG. 10G, an insulating material (insulating film) 31 such as a silicon oxide film, a polysilicon film or the like is embedded to planarize the opposite surface of the base. Now, as illustrated in FIG. 10H, an interlayer insulating material (insulating film) 32 such as a silicon oxide film is deposited by a CVD method or the like, and is processed in desired regions by a photolithographic step and a wet etching method or the like. Next, as illustrated in FIG. 10I, a source contact layer 21 and a gate contact layer 102, both made of a nickel film or the like, are deposited on the surface of the SiC base which is then annealed at temperatures ranging from several hundreds to several thousands of degrees to form a silicon/metal reaction region between the metal film and the SiC substrate. Then, a metal film made of aluminum or the like is deposited to form a source electrode 23 and a gate electrode 103, and the resulting product is annealed at temperatures of several hundreds of degrees, resulting in the completion of the SIT according to the first embodiment as illustrated in FIG. 1.

According to the foregoing embodiment, since the semiconductor device can accomplish a low gate reverse bias and a low on-resistance, the semiconductor device, when used as a switching device for an PWM inverter, can advantageously facilitate gate driving and reduce a loss.

It should be further understood by those skilled in the art that although the foregoing description has been made on embodiments of the invention, the invention is not limited thereto and various changes and modifications may be made without departing from the spirit of the invention and the scope of the appended claims.

What we claim is:

1. A silicon carbide semiconductor device having a vertical field effect transistor, said field effect transistor comprising:
    a substrate of a first conductivity type having a low concentration of impurity, said substrate constituting a semiconductor substrate, the band gap of which is 2.0 eV or more;
    a drain electrode formed over one surface of said substrate;
    an epitaxial layer of the first conductivity type formed on an opposite surface of said substrate and having a lower resistance than said substrate;
    a source region of the first conductivity type formed along the opposite surface of said semiconductor substrate;
    a plurality of first grooves formed from the opposite surface of said semiconductor substrate;
    a first gate region of a second conductivity type formed along said first grooves;
    a source contact layer formed on an opposite surface side of said source region;
    a source electrode in ohmic contact with said source contact layer;
    a second groove formed from the opposite surface of said semiconductor substrate;
    a second gate region of the second conductivity type formed along said second groove;
    a gate electrode in ohmic contact with a draw-out layer in said second gate region through a gate contact layer; and
    a metal conductor in ohmic contact with a contact layer in said gate region on the bottom of each said first groove independently of said gate electrode.

2. A silicon carbide semiconductor device according to claim 1, wherein said metal conductor is electrically isolated from said gate electrode.

3. A silicon carbide semiconductor device according to claim 1, wherein said metal conductor is electrically isolated from a wire from the outside.

4. A silicon carbide semiconductor device according to claim 1, wherein said gate region formed along said first grooves is formed to be in contact with said source region formed along the opposite surface of said semiconductor substrate.

* * * * *